United States Patent [19]
Ushiki et al.

[11] Patent Number: 5,951,283
[45] Date of Patent: Sep. 14, 1999

[54] SUBSTRATE TRANSPORTING DEVICE

[75] Inventors: Hiroshi Ushiki, Iruma; Tetsuya Kobaru, Musashimurayama; Kazuo Sugiura, Akishima, all of Japan

[73] Assignee: Kabushiki Kaisha Shinkawa, Tokyo, Japan

[21] Appl. No.: 09/116,703

[22] Filed: Jul. 16, 1998

[30] Foreign Application Priority Data

Jul. 17, 1997 [JP] Japan ................................ 9-207420

[51] Int. Cl.⁶ ............................................. F27D 3/12
[52] U.S. Cl. ............................................ 432/253; 432/245
[58] Field of Search .................................. 432/225, 226, 432/227, 231, 239, 245, 253

[56] References Cited

U.S. PATENT DOCUMENTS

| 5,716,207 | 2/1998 | Mishina et al. | 432/253 |
| 5,762,745 | 6/1998 | Hirose | 432/253 |
| 5,837,555 | 11/1998 | Kaltenbrunner et al. | 432/253 |

FOREIGN PATENT DOCUMENTS

| S55-11345 | 1/1980 | Japan . |
| S55-88351 | 7/1980 | Japan . |
| S63-56121 | 11/1988 | Japan . |
| H6-80691 | 10/1994 | Japan . |

*Primary Examiner*—Teresa Walberg
*Assistant Examiner*—Gregory A. Wilson
*Attorney, Agent, or Firm*—Koda & Androlia

[57] ABSTRACT

A substrate transporting device used in the process of manufacturing, for instance, semiconductor chips including a substrate guide comprised of a substrate guide rail which guides one side of each substrate and a substrate supporting plate which supports another side of the substrate, feeding claws for feeding a substrate to, for instance, a bonding position, the feeding claws being provided on a feeding claw holder and extending in the direction perpendicular to the substrate supporting plate, a claw X-direction feeder which moves the feeding claw holder in a direction in which the substrate is conveyed along the substrate guide, and a claw Y-direction feeder which moves the feeding claw holder in a direction perpendicular to the direction in which the substrate is conveyed along the substrate guide; thus, the substrates are conveyed one pitch at a time by means of a rectangular motion of the feeding claws on a horizontal plane effected by the claw X-direction feeder and the claw Y-direction feeder.

6 Claims, 8 Drawing Sheets

SUBSTRATE TRANSPORTING DEVICE

BACKGROUND OF THE INVENTION

1. Field of the Invention

The present invention relates to a substrate transporting device.

2. Prior Art

Conventionally, the following two types of devices are known for transporting substrates used in manufacturing, for instance, semiconductor chips.

In the first type, feeding claws or feeding pins perform a rectangular motion within a vertical plane (known as a tact operation) and push the rear ends of the substrates (or the feeding pins are inserted into holes of the substrates), so that the substrates are fed one pitch at a time by the feeding claws or feeding pins. In this type, the feeding claws or feeding pins extend downward from above or extend upward from below. Japanese Patent Application Laid-Open (Kokai) Nos. S55-11345 and S55-88351 are, respectively, examples that teach this type of device.

The second type of device includes upper and lower claws that make a rectangular motion in a vertical plane. In this device, the substrates are held from above and below by the upper and lower claws and fed one pitch at a time. Japanese Patent Application Publication (Kokoku) Nos. S63-56121 and H6-80691, for example, disclose this type of device.

In devices of the first type that include the feeding claws or feeding pins extending downward from above, the window damper which presses the substrates against the beating block interferes with the movement of the feeding claws or the feeding pins. Accordingly, so as to solve this problem, the window damper is split so as to form a passage which the feeding claws or feeding pins pass through. However, when the window damper is split, the strength of the window damper decreases greatly, and the substrates are not held firmly. Furthermore, the portion of the split window damper that forms a passage for the feeding claws or feeding pins cannot firmly hold the substrates; accordingly, when bonding points are located in this area, the bonding quality drops. So as to overcome these problems and perform good bonding stably, it is necessary to re-position the feeding claws or feeding pins to positions which avoid the bonding points on the substrates; and it is also necessary to change or replace the window damper to one that matches the re-positioning.

Furthermore, in a wire bonding apparatus, a bonding tool through which the wire passes and an electric torch electrode which forms a ball on the tip end of the wire, etc., are provided at the tip end of a bonding arm that is installed on the bonding head; and the attachment positions of these parts are set as low as possible (i. e., as close to the substrate as possible) so as to avoid the bonding speed from decreasing. Accordingly, the feeding claws or feeding pins must feed the substrates after the bonding head has been withdrawn to a predetermined location so that the feeding claws or feeding pins do not contact the bonding tool or electric torch electrode, etc. when the substrates are fed by the feeding claws or feeding pins.

In devices of the above-descried first type that include the feeding claws or feeding pins extending upward from below and feeds the substrates by pushing substantially the central portions of the substrates, it is necessary to form a passage for the feeding claws or feeding pins by splitting the heating block. Furthermore, when the feeding claws or feeding pins are installed on the substrate guide rail side, the width of the heating block must be reduced by a corresponding amount.

Accordingly, in these types of devices, when the positions of the feeding claws or feeding pins are to be altered, the relationship with the heating block prevents a simple positional alteration. Furthermore, if the heating block is not installed on the undersides of the substrates in the positions of the bonding points on the substrates, the substrates are not heated, and favorable bonding cannot be performed. Accordingly, the feeding claws or feeding pins must be installed in positions which can avoid the bonding points on the substrates. It is, therefore, necessary to change the positions of the feeding claws or feeding pins in each case according to the substrates to be handled. It is further necessary to change the heating block to one that conforms to these positions. In addition, since the feeding claws or feeding pins are hidden beneath the substrates, maintenance work is difficult.

In devices of the second type, since the substrates are held by feeding claws (upper and lower claws), bonding cannot be performed in the area held by the feeding claws or the area near the area held by the feeding claws. Furthermore, in the case of a window clamper that has a broader bonding area, there is considerable interference between the window clamper and the feeding claws. In addition, since the space through which the lower claws pass must be installed on the substrate guide rail side, the width of the heating block is reduced by a corresponding amount. Moreover, since the substrates which are heated are held by the feeding claws, the heat of the substrates escapes through the feeding claws.

SUMMARY OF THE INVENTION

Accordingly, the first object of the present invention is to provide a substrate transporting device in Which there is no need to split the window damper or heating block or to reduce the width of the heating block, in which the bonding quality is improved, and in which an increased bonding area can be secured.

The second object of the present invention is to provide a substrate transporting device in which the heat of heated substrates is prevented from escaping, in which maintenance can easily be performed, and in which substrates with a low mechanical strength can be fed without any stress being applied to the substrates.

The above objects are accomplished by a first unique structure for a substrate transporting device which comprises: a guide means which guides a substrate, a heating block which heats the substrate, a window damper which is installed above the heating block and presses the substrate against the heating block, and a plurality of feeding claws which are installed at equal intervals along the direction in which substrates are conveyed (called "substrate conveying direction") so as to feed the substrate one pitch at a time along the guide means; wherein the guide means is comprised of a substrate guide rail, which guides one side surface of the substrate, and a substrate supporting plate, which supports the undersurface of each substrate at the other side surface of the substrate; the feeding claws are provided on a feeding claw holder and extend in the direction perpendicular to the substrate supporting plate on the side of the substrate supporting plate; and the substrate transporting device is further comprised of a claw X-direction feed driving means, which causes the feeding claw holder to move in the X direction that is the substrate conveying direction, and a claw Y-direction feed driving means, which causes the feeding claw bolder to move in the Y direction that is oriented on the horizontal plane perpendicular to the substrate conveying direction; and wherein the substrate is fed one pitch at a time by means of a rectangular motion of the feeding claws on the horizontal plane that is effected by the claw X-direction feed driving means and the claw Y-direction feed driving means.

The abode objects are accomplished by a second unique structure for a substrate transporting device which further includes, in addition to the first structure above, a positioning claw and a positioning claw holder; and the positioning claw holds a substrate together with the feeding claw which feeds a substrate located before the clamper, and the positioning claw holder is provided with the positioning claw and moved together with the feeding claw holder.

Furthermore, the above objects are accomplished by a still another unique structure wherein the feeding claw holder in either one of the above structures is driven so as to correct the attitude of the substrates by the side surface of the feeding claw holder when the feeding claw holder is moved in the substrate conveying direction.

In addition, in the second structure described above, the positioning claw holder is installed on the feeding claw holder so as to be slidable in the substrate conveying direction, the positioning claw holder being driven by a spring so as to follow the movement of the feeding claw holder in the substrate conveying direction.

In addition, a positioning setting means may be provided in the above structure so as to regulate the stopping position of the positioning claw in the substrate conveying direction.

DETAILED DESCRIPTION OF THE PREFERRED EMBODIMENTS

An embodiment of the present invention will be described with reference to FIGS. 1 through 6.

Figure 1:
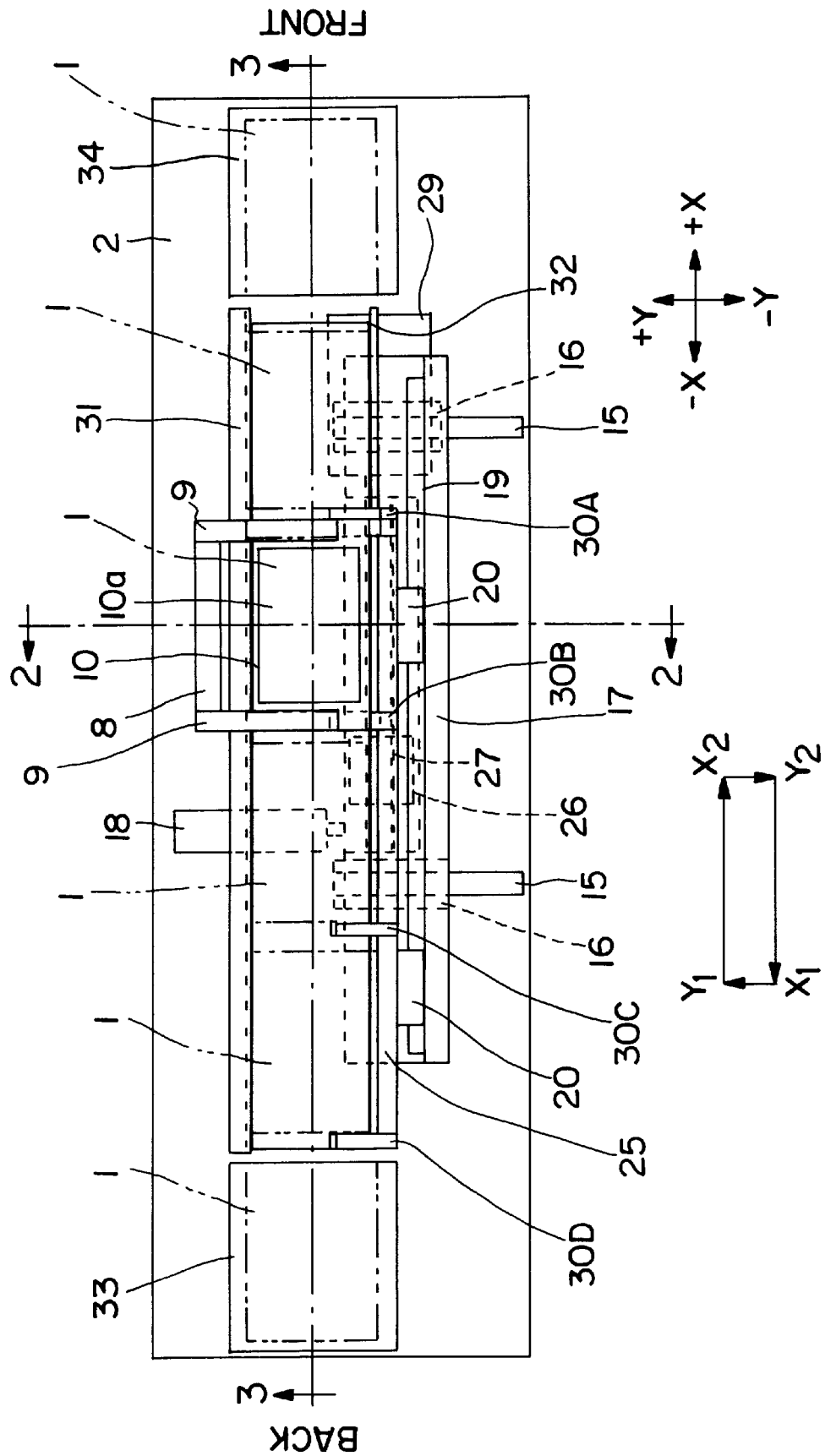
FIG. 1 is a plan view which illustrates one embodiment of the substrate transporting device of the present invention.
Figure 2:
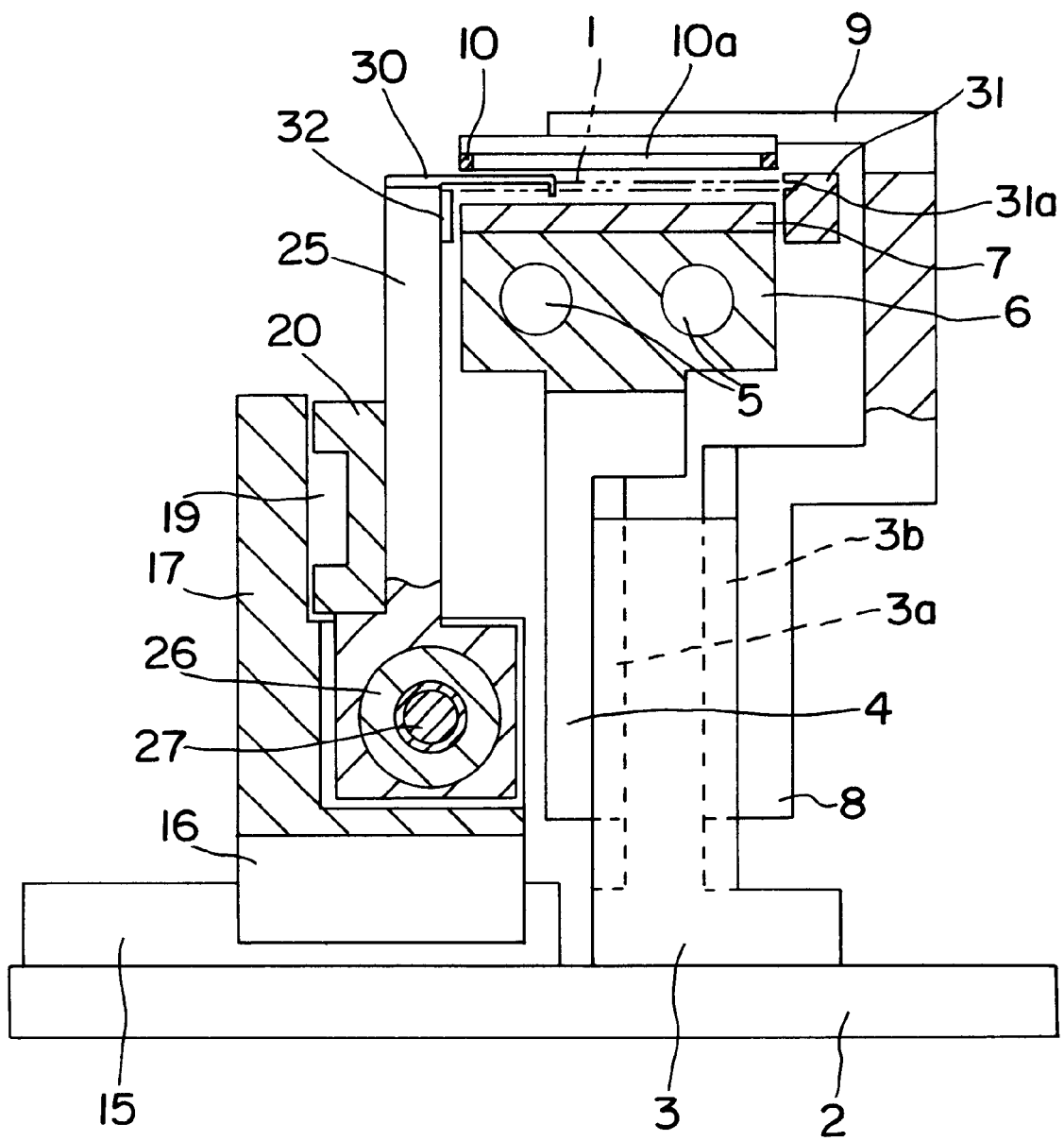
FIG. 2 is an enlarged sectional view taken along the line 2—2 in FIG. 1.
Figure 3:
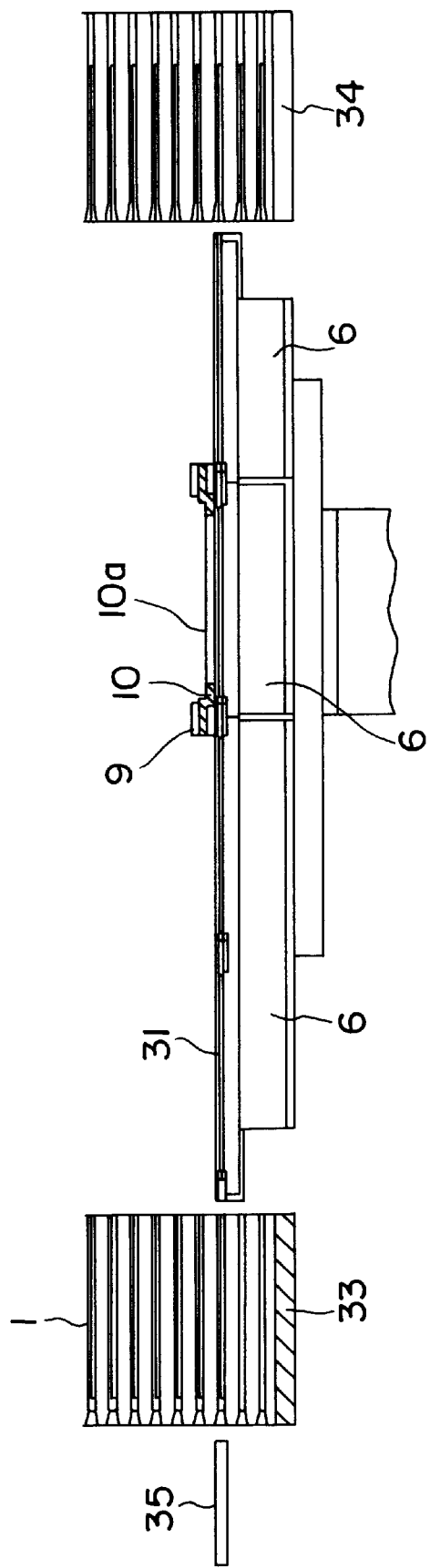
FIG. 3 is a sectional view taken along the line 3—3 in FIG. 1.

As shown in FIGS. 1 through 3, a stand 3 is fastened to a base plate 2, and a heating block holder sliding part 3a and damper holder sliding part 3b which extend vertically are formed on both side surfaces of the stand 3. A heating block holder 4 is installed on the heating block holder sliding part 3a so as to be raised and lowered by a driving means (not shown), and a heating block 6 which contains a heater 5 is fastened to the upper surface of the heating block holder 4. In addition, a heating plate 7 is fastened to the upper surface of the heating block 6. A damper holder 8 is installed on the damper holder sliding part 3b so that the clamper holder 8 can be raised and lowered by a driving means (not shown), and a damper holder 9 which extends over the heating plate 7 is fastened to the upper surface of the damper holder 8. A window clam per 10 in which a bonding window 10a is formed is fastened to the clamper holder 9. The structure above is a universally known structure.

Claw Y-direction feeding guide rails 15, which are oriented in the Y direction (direction of width of the substrate 1) on the horizontal plane perpendicular to the conveying direction of the substrates 1 (i. e., the +X direction), are provided on the base plate 2. Sliders 16 are installed on the claw Y-direction feeding guide rails 15 so as to be slidable thereon, and a frame 17 which is oriented in a vertical direction, as viewed in FIG. 2, is mounted on the sliders 16. The sliders 16 are driven by a cylinder 18 which is disposed on the base plate 2. A claw X-direction guide rail 19 which extends in the X direction is fastened to the side surface (on the right side surface in FIG. 2) of the frame 17, and sliders 20 are installed on the claw X-direction feeding guide rail 19 in a slidable fashion.

A feeding claw holder 25 is fastened to the sliders 20, and an internally threaded screw 26 is provided in the lower portion of the feeding claw holder 25 so that the axis of the screw 26 is oriented in the X direction. The internally threaded screw 26 engages with an externally threaded screw 27 whose axis is installed so as to be oriented in the X direction. Both ends of the externally threaded screw 27 are supported by bearings (not shown) fastened to the frame 17 so that the externally threaded screw 27 is rotated. The output shaft of a claw X-direction feed driving motor 29 which is mounted on the frame 17 is connected to one end of the externally threaded screw 27. Four feeding claws 30 (30A, 30B, 30C and 30D) which feed the substrates 1 are disposed on the upper end of the feeding claw holder 25. These feeding claws 30 are installed at equal intervals for a distance that exceeds the length of one substrate 1.

As best seen in FIG. 1, a substrate guide rail 31 which guides the substrates I is installed near the heating plate 7 so as to be located between the heating plate 7 and the damper holder 8; a substrate supporting plate 32 which supports the undersurface of the substrates 1 is installed near the heating plate 7 so as to be located between the heating plate 7 and the feeding claw holder 25; and a loader side magazine 33 and an unloader side magazine 34 are, as best seen from FIG. 1, respectively installed at either end of the substrate guide rail 31 and substrate supporting plate 32. The loader side magazine 33 and unloader side magazine 34 are provided on universally known elevator devices (not shown) and raised and lowered intermittently. The substrates 1 accommodated inside the loader side magazine 33 are fed out by a pusher 35 so that one side of each substrate is on the substrate supporting plate 32 and another side of the substrate is in a guide groove 31a of the substrate guide rail 31.

Next, the operation of the above embodiment will be described.

In this embodiment, as shown in FIG. 1, the feeding claw holder 25 that has claws 30 thereon makes a rectangular movement on the horizontal plane as shown in FIG. 1 so as to feed the substrates 1 one pitch at a time by the feeding claws 30. In other words, one cycle of the one-pitch feeding operation of each substrate 1 is accomplished by the following sequence of movements: the feeding claw holder 25 moves from the original position X, to Y. in the horizontal direction (Y direction) perpendicular to the substrate feeding direction (X direction), and then to $X_2$ in the +X direction, $Y_2$ in the −Y direction, and $X_1$ in the −X direction.

Next, details of the feeding operation will be described with reference to FIGS. 4 through 6 and others.

Figure 4A:
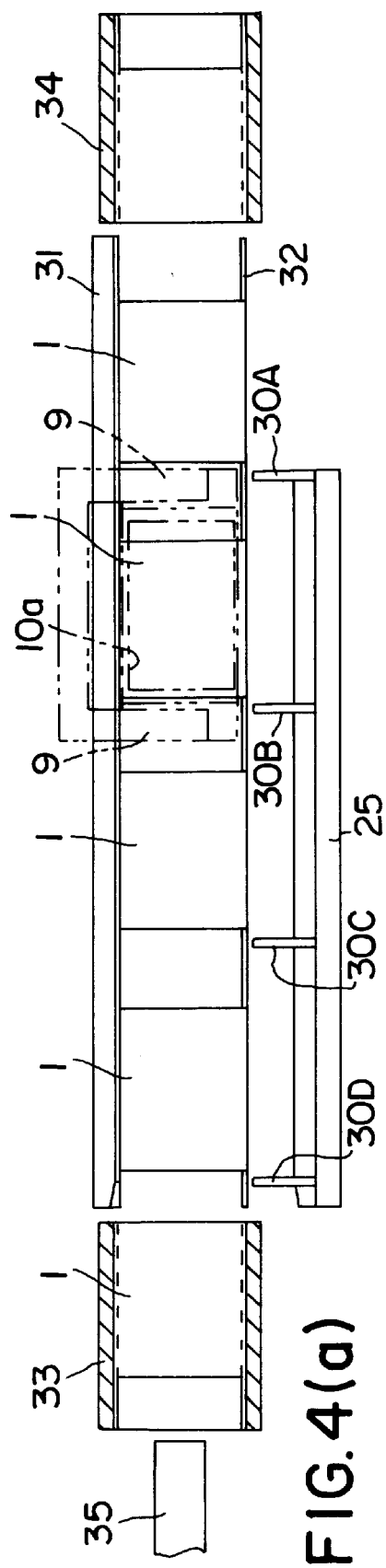
FIGS. 4(a) through 4(c) are explanatory plan views which illustrate the operation of the feeding claws.
Figure 6A:
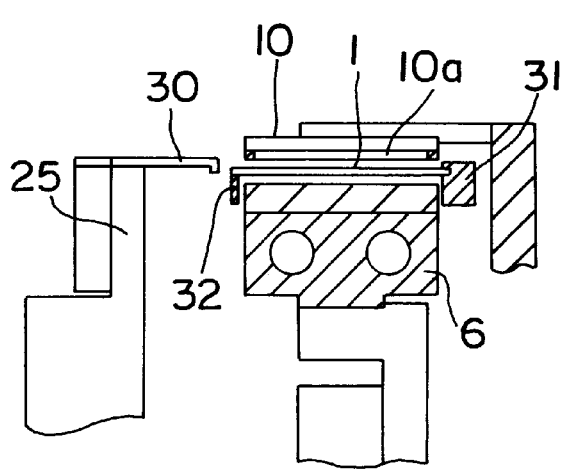
FIGS. 6(a) through 6(d) are sectional side views which illustrate the operation of the feeding claws.

As shown in FIG. 4(a) and FIG. 6(a), the heating block 6 is at the lowered position, and a substrate accommodating part of the loader side magazine 33 in which a substrate 1 is accommodated is at the stopped position so as to be on the conveying path level. The feeding claws 30 are in the position where it is removed from the substrate conveying path (origin position $X_1$), End the window clamper 10 is in a raised position. In this state, the pusher 35 is actuated and pushes out the substrate 1, which is inside the loader side magazine 33, onto the surface of the substrate supporting plate 32 and into the guide groove 31a of the substrate guide rail 31.

Figure 4B:
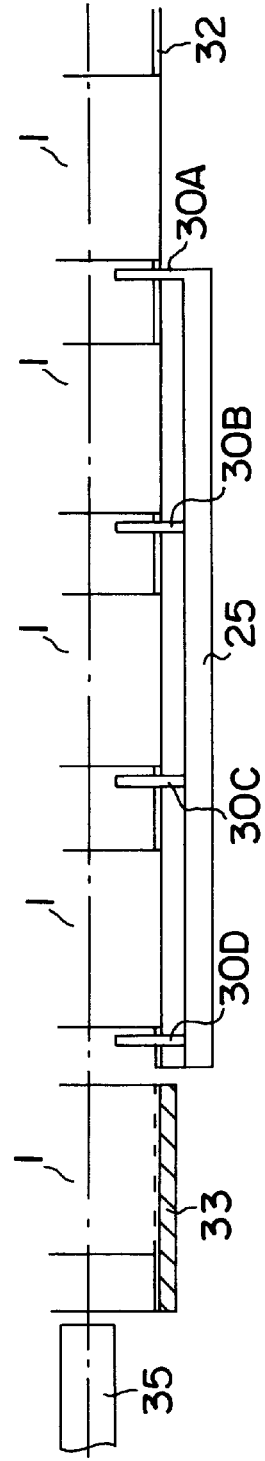
Figure 6B:
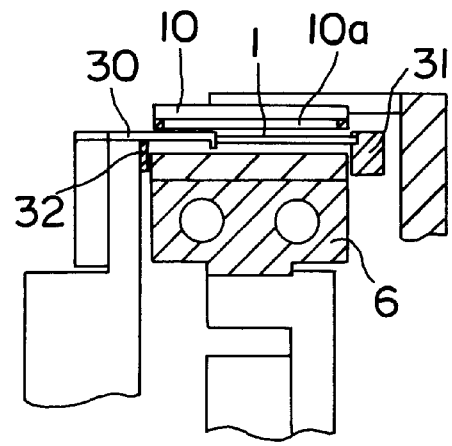

Next, the operating rod (not shown) of the cylinder 18 (see FIGS. 1 and 7) is retracted, so that the sliders 16 are moved toward the heating block 6 while being guided on the claw Y-direction feeding guide rails 15. As a result, the frame 17, claw X-direction feeding guide rail 19, sliders 20, feeding claw holder 25, internally threaded screw 26, externally threaded screw 27 and claw X-direction feed driving motor 29 (see FIGS. 1 and 7) are all moved in the +Y direction toward the heating block 6; and the feeding claws 30 are positioned at the rear ends of the respective substrates 1 as shown in FIGS. 4(b) and 6(b). At the same time, the side surface of the feeding claw holder 25 contacts one side of each substrate 1 and corrects the inclination (attitude) of each substrate 1.

Next, the claw X-direction feeding motor 29 is actuated, and the externally threaded screw 27 is rotated, thus causing the sliders 20, internally threaded screw 26, feeding claw holder 25 and feeding claws 30 to move in the +X direction by an amount that corresponds to one pitch of the feeding claws 30 while being guided by the claw X-direction feeding guide rail 19. As a result, as shown in FIG. 4(c), the substrates 1 are pushed at their rear ends by the feeding claws 30, so that the substrates 1 are fed by one pitch along the substrate guide rail 31 and substrate supporting plate 32.

Figure 4C:
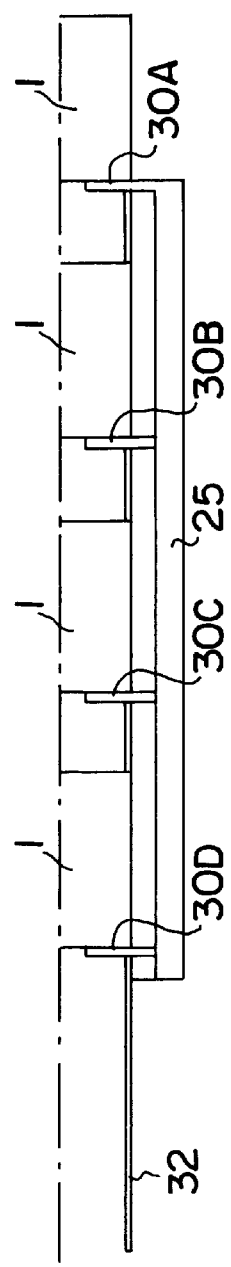
Figure 6C:
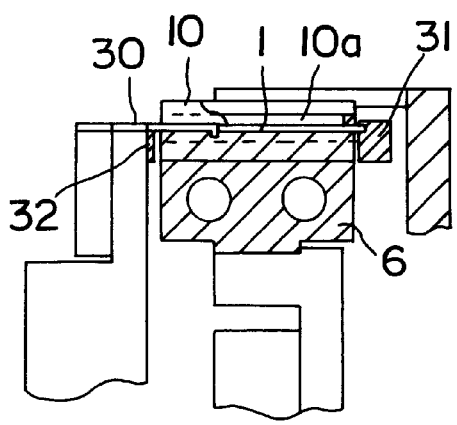

Next, as shown in FIGS. 4(c) and 6(c), the heating block 6 is raised so that the heating block 6 contacts the substrates 1. Further, the window damper 10 is lowered so that the substrate 1 is pressed against the heating plate 7. Then, bonding (die bonding or wire bonding) is performed on this substrate 1 by a bonding apparatus (not shown).

Figure 5A:
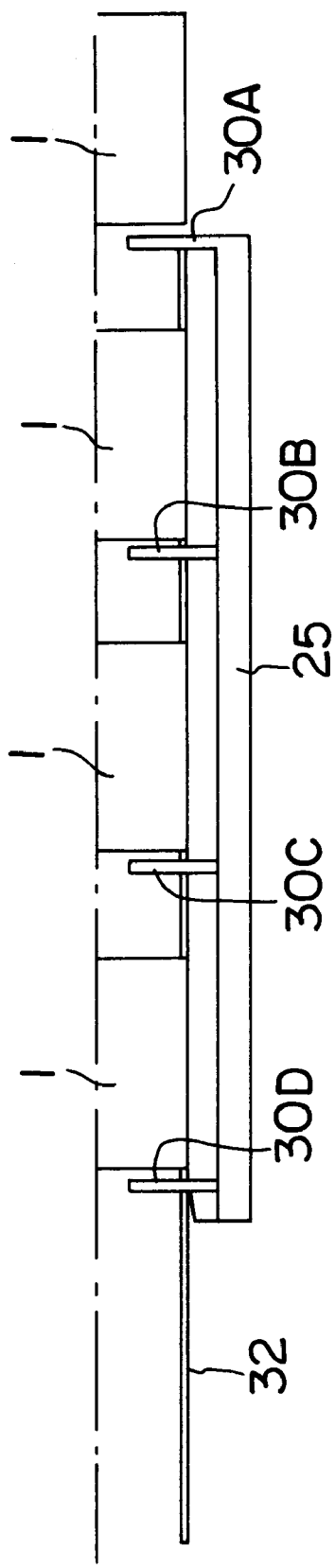
FIGS. 5(a) and 5(b) are explanatory plan views which illustrate the operation of the feeding claws after the operation shown in FIG. 4.
Figure 5B:
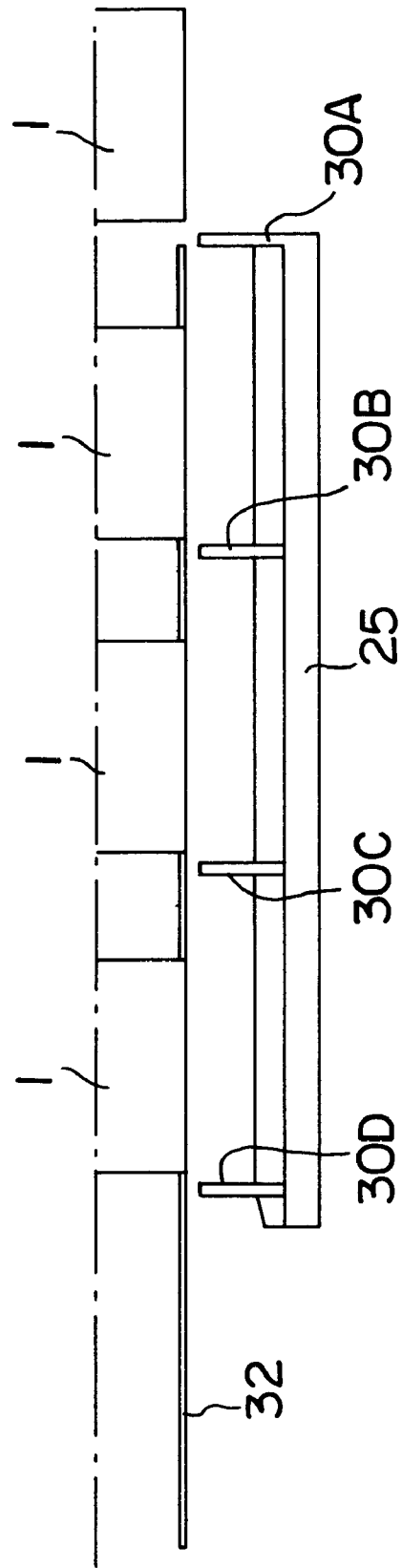
Figure 6D:
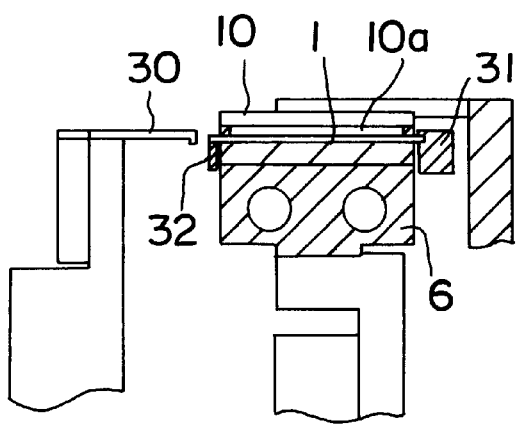

During this operation, the claw X-direction feeding motor 29 is rotated slightly in the reverse direction, so that the feeding claws 30 are slightly moved in the –X direction and are thus separated from the rear ends of the substrates 1 as shown in FIG. 5(a). Then, the operating rod of the cylinder 18 is operated to protrude so that the sliders 16 are moved in the –Y direction, thus causing the tip ends of the feeding claws 30 to return to positions outside the conveying path of the substrates 1 as shown in FIGS. 5(b) and 6(d). Next, the claw X-direction feeding motor 29 is rotated in the reverse direction so that the feeding claws 30 are moved in the –X direction, thus causing the feeding claws 30 to return to the original origin positions, resulting in the state shown in FIGS. 4(a) and 6(a).

While the feeding claws 30 feed each substrate 1 by one pitch and then return to the origin positions as described above, the loader side magazine 33 is lowered by one step, and the next substrate accommodating part of the magazine is brought to the substrate conveying level; after which the pusher 35 is actuated so as to feed out a substrate 1 onto the substrate supporting plate 32 and into the guide groove 31a of the substrate guide rail 31 as described above. After bonding is completed on a given substrate 1, the heating block 6 is lowered, and the window damper 10 is raised. Afterward, one cycle of the one-pitch feeding operation of the substrates 1 by the feeding claws 30 is performed. As a result of this series of operations substrates 1 on which bonding has been completed are successively fed and accommodated in the unloader side magazine 34. When one substrate 1 is accommodated in the unloader side magazine 34, the unloader side magazine 34 is lowered by one step, so that the next substrate accommodating part is brought to the level of the substrate conveying path, thus allowing the magazine 34 to receive the next substrate 1 on which bonding has been completed.

As seen from the above, the feeding claws 30 feed the substrates 1 by making a rectangular movement in the X and Y directions on a horizontal plane between the window damper 10 and the heating block 6 (or more accurately, the heating plate 7). Accordingly, there is no need to split the window damper 10 or heating block 6, and it is not necessary to reduce the width of the heating block 6. As a result, it is possible to increase the bonding area, the substrates 1 can be securely held so that the bonding quality can be improved, and even if the type of substrate 1 to be handled should change, there is no need to re-position the feeding claws 30. Moreover, places where bonding cannot be performed on the substrates 1 do not exist, and there is no escape of heat from the heated substrates 1. Furthermore, it is possible to increase the portions of the feeding claws 30 that contact the substrates 1, so that stress is not applied to substrates 1 which generally have a low mechanical strength.

Figure 7:
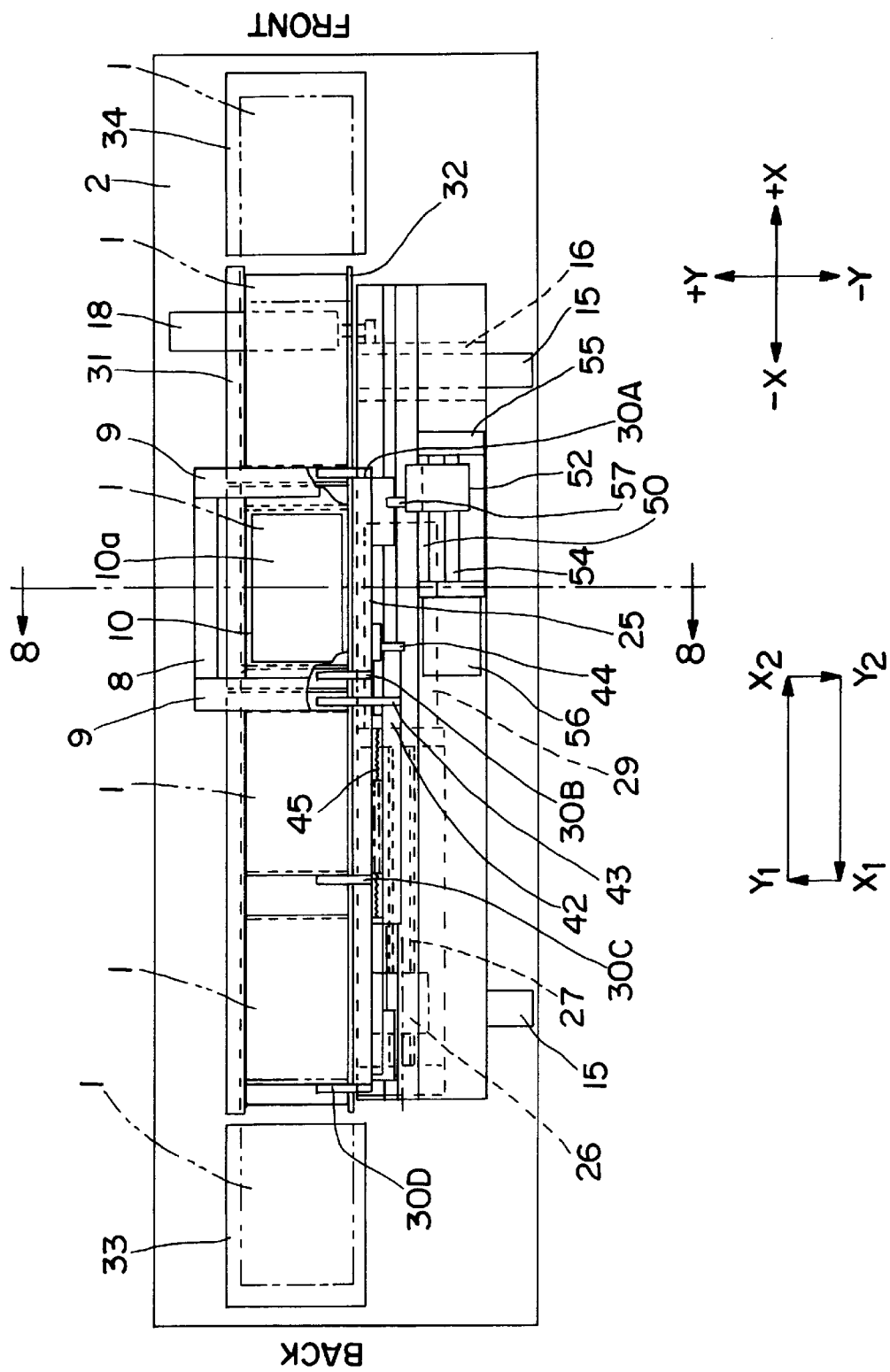
FIG. 7 is a plan view which illustrates another embodiment of the substrate transporting device of the present invention.
Figure 8:
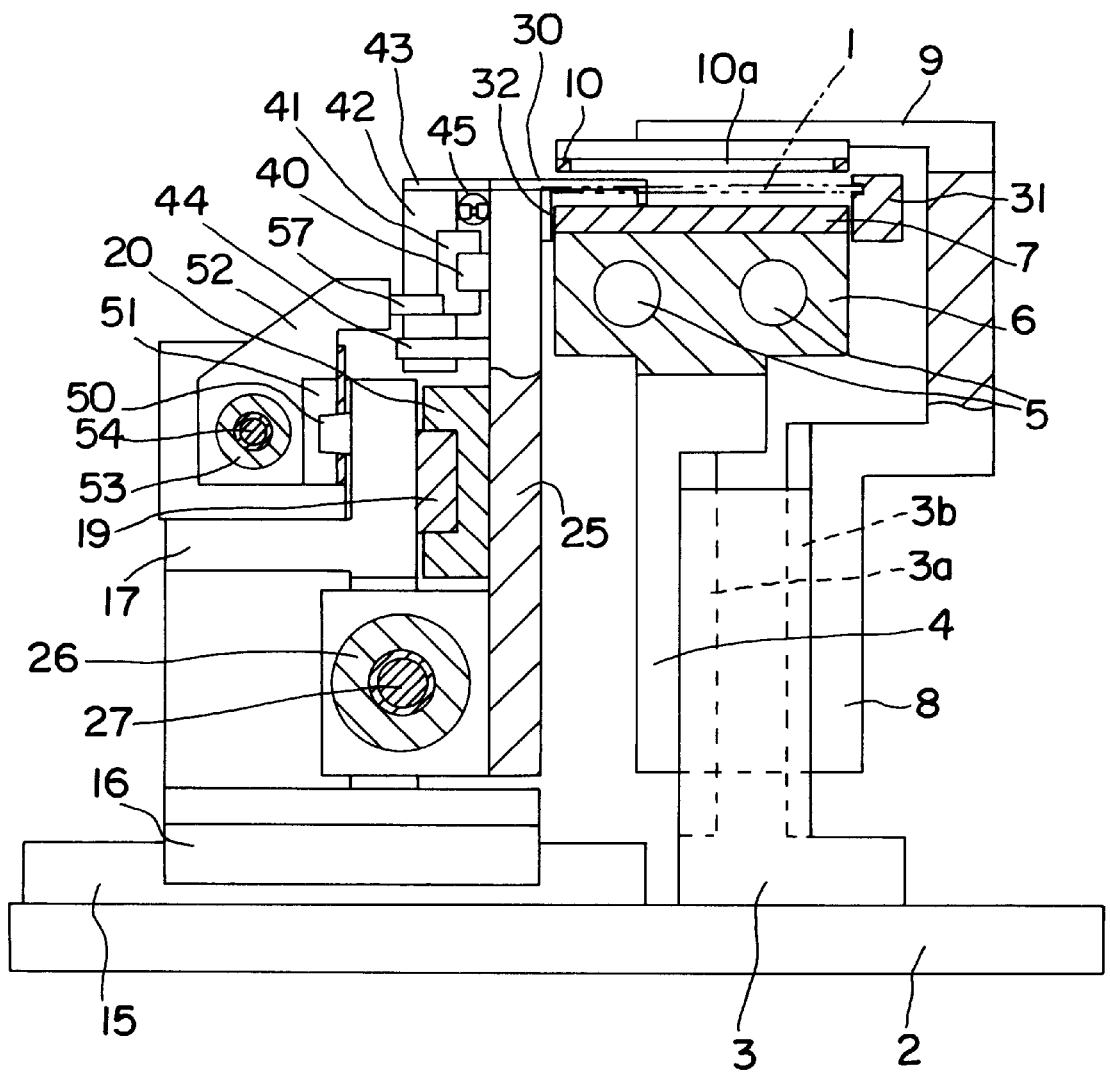
FIG. 8 is an enlarged sectional view taken along the line 8—8 in FIG. 7.

Another embodiment of the present invention will be described with reference to FIGS. 7 and 8. Parts which are the same as those in FIGS. 1 through 6 or which correspond to such parts are labeled with the same symbols, and a detailed description of such parts is omitted.

A positioning claw feeding guide rail 40 which extends in the X direction is provided on the outer side surface (left side surface in FIG. 8) of the feeding claw holder 25 so as to be located above the sliders 20, and a slider 41 is slidably installed on this positioning claw feeding guide rail 40. A positioning claw holder 42 is installed on the slider 41, and a positioning claw 43 is disposed on the upper surface of the positioning claw holder 42. Here, the positioning claw 43 is provided so that the positioning claw 43 is positioned on the back of the second feeding claw from the front, i. e., the feeding claw 30B as seen from FIG. 8. Furthermore, a stopper 44 is fastened to the outer side surface of the feeding claw holder 25 so as to face the front surface of the positioning claw holder 42. Both ends of a spring 45 are attached to the feeding claw holder 25 and the positioning claw holder 42, and the positioning claw holder 42 is caused to contact the stopper 44 by the spring force of this spring 45.

A positioning claw position setting guide rail 50 which extends in the X direction is fastened to the forward portion of the outer side surface of the frame 17. A slider 51 is slidably installed on this positioning claw position setting guide rail 50. A stopper holder 52 is fastened to the slider 51, and an internally threaded screw 53 whose axis is oriented in the X direction is fastened to the stopper holder 52. The internally threaded screw 53 is screw-engaged with an externally threaded screw 54, and one end of this externally threaded screw 54 is rotatably supported on a bearing 55 which is provided on the frame 17. The output shaft of a positioning claw position setting motor 56 which is fastened to the frame 17 is linked to the other end of the externally threaded screw 54. A stopper 57 is fastened to the upper side surface of the stopper holder 52 that faces the front surface of the positioning claw holder 42.

Next, the operation will be described. In the previously described embodiment, when the feeding claw holder 25 from $Y_1$ to $X_2$ is moved at high speed in order to achieve highspeed substrate feeding, the substrates 1 would fly out as a result of inertia, so that the position of the substrate 1 fed to the area of the bonding window 10a by the feeding claw 30C would become unstable. An improvement on this point is made in the second embodiment.

The operation in which the substrates 1 are fed by the rectangular movement of the feeding claws 30 effected by the operation of the cylinder 18 and the rotation of the claw X-direction feeding motor 29 is the same as in the first embodiment. In this second embodiment, the positioning claw holder 42 to which the positioning claw 43 is fastened is provided on the feeding claw holder 25 via the slider 41 and positioning claw feeding guide rail 40; accordingly, when the feeding claw holder 25 is moved in the Y direction, i.e., from $X_1$ to $Y_1$, or from $X_2$ to $Y_2$, the positioning claw 43 is also moved in the same direction together with the feeding claws 30. In this case, when the feeding claw holder 25 is moved from $X_1$ to $Y_1$, the positioning claw 43 is positioned in front of the substrate 1 located before the bonding window 10a (or on the left side of the bonding window 10a in FIG. 7).

When the feeding claw holder 25 is moved from $Y_1$ to $X_2$ in the +X direction, the positioning claw holder 42 is caused to follow the stopper 44 by the spring force of the spring 45 and thus moved in the same direction as the feeding claw holder 25. In other words, the substrate 1 positioned before the bonding window 10a is fed while being clamped by the positioning claw 43 and the feeding claw 30C. Thus, during the operation in which the feeding claw holder 25 is moved by one pitch from $Y_1$ to $X_2$, the positioning claw position setting motor 56 is actuated so that the stopper 57 is moved to a pre-set setting position. Here, the setting position of the stopper 57 is set so that when the feeding claw holder 25 is moved from $Y_1$ to $X_2$, and the positioning claw holder 42 contacts the stopper 57 so that the movement of the positioning claw 43 (as will be described below) is stopped, then the substrate 1 has a clearance of approximately 0.3 mm between the feeding claw 30C and the positioning claw 43.

When the feeding claw holder 25 is moved from $Y_1$ to $X_2$, the substrate 1 is fed into the bonding window 10a while being held by the positioning claw 43 and the feeding claw 30C. Immediately prior to the completion of this feeding operation, the positioning claw holder 42 contacts the stopper 57, and the movement of the positioning claw 43 is stopped. However, the feeding claw holder 25 and feeding claws 30 subsequently move by a small amount, and then stop, so that the substrate 1 is held between the feeding claw 30C and the positioning claw 43 with a clearance of approximately 0.3 mm.

Thus, since the substrate 1 is fed while being held by the feeding claw 30C and positioning claw 43, any flying out of the substrate 1 is prevented by the positioning claw even if the conveying is done at a high speed. Accordingly, the positional precision of substrates 1 fed into the area of the bonding window 10a is improved.

As seen from the above, the substrate conveying device of the present invention includes: a guide means which guides the substrates and comprises a substrate guide rail, which guides one side surface of each substrate, and a substrate supporting plate, which supports the undersurface of the other side surface of the substrate; feeding claws provided on a feeding claw holder and extend in the direction perpendicular to the substrate supporting plate on the side of the substrate supporting plate side; a claw X-direction feed driving means, which causes the feeding claw holder to move in the X direction that is a substrate conveying direction; and a claw Y-direction feed driving means, which causes the feeding claw holder to move in the Y direction that is oriented on the horizontal plane perpendicular to the substrate conveying direction. With this structure, the substrates are fed one pitch at a time by a rectangular motion of the feeding claws on the horizontal plane effected by the claw X-direction feed driving means and the claw Y-direction feed driving means. Accordingly, there is no need to split the window damper or heating block, or to reduce the width of the heating block. Consequently, bonding quality can be improved, and the bonding area can be increased. Furthermore, heat does not escape from the heated substrates, and maintenance can easily be performed. In addition, stress is not applied to substrates which have a low mechanical strength.

Furthermore, by additionally providing a positioning claw, which holds the substrates together with the feeding claw that feeds the substrates located before the window clamper, and a positioning claw holder, which is installed with the positioning claw and moved together with the feeding claw holder, it is possible to improve the positional precision of the substrates fed into the area of the window clamper, in addition to the advantages obtained in the structure above.

What is claimed is:

1. A substrate transporting device comprising: a guide means which guides a substrate, a heating block which heats said substrate, a window clamper which is installed above said heating block so as to press said substrate against said heating block, and a plurality of feeding claws which are installed at equal intervals along a substrate conveying direction so as to feed said substrate one pitch at a time along said guide means, wherein said guide means is comprised of a substrate guide rail, which guides one side surface of said substrate, and a substrate supporting plate, which supports an undersurface adjacent to another side surface of said substrate, and said feeding claws are provided on a feeding claw holder and extend in a direction perpendicular to said substrate supporting plate, wherein said transporting device is further comprised of a claw X-direction feed driving means which causes said feeding claw holder to move in an X direction that is said substrate conveying direction, and a claw Y-direction feed driving means which causes said feeding claw holder to move in a Y direction that is oriented on a horizontal plane perpendicular to said substrate conveying direction, and wherein said substrate is fed one pitch at a time by means of a rectangular motion of said feeding claws on said horizontal plane that is effected by said claw X-direction feed driving means and said claw Y-direction feed driving means.

2. A substrate transporting device according to claim 1, further comprising a positioning claw which is installed so as to hold said substrate together with said feeding claw which feeds a substrate positioned before said window clamper, and a positioning claw holder which is provided with said positioning claw and moved together with said feeding claw holder.

3. A substrate transporting device according to claim 2, wherein said feeding claw holder is driven so as to correct an attitude of said substrate by a side surface of said feeding claw holder when said feeding claw holder is moved in said substrate conveying direction.

4. A substrate transporting device according to claim 2, wherein said positioning claw holder is provided on said feeding claw holder so as to be slidable in said substrate conveying direction, said positioning claw holder being urged by a spring means so that said positioning claw holder follows a movement of said feeding claw holder in said substrate conveying direction.

5. A substrate transporting device according to claim 4, further comprising a positioning setting means which regulates a stopping position of said positioning claw in said substrate conveying direction.

6. A substrate transporting device according to claim 1, wherein said feeding claw holder is driven so as to correct an attitude of said substrate by a side surface of said feeding claw holder when said feeding claw holder is moved in said substrate conveying direction.

* * * * *